(12) United States Patent
Yanagisawa

(10) Patent No.: US 9,075,206 B2
(45) Date of Patent: Jul. 7, 2015

(54) OPTICAL WAVEGUIDE DEVICE

(71) Applicant: SHINKO ELECTRIC INDUSTRIES CO., LTD., Nagano-shi, Nagano (JP)

(72) Inventor: Kenji Yanagisawa, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 0 days.

(21) Appl. No.: 14/105,598

(22) Filed: Dec. 13, 2013

(65) Prior Publication Data

US 2014/0177999 A1 Jun. 26, 2014

(30) Foreign Application Priority Data

Dec. 20, 2012 (JP) ................................. 2012-277550

(51) Int. Cl.
*G02B 6/42* (2006.01)
*G02B 6/43* (2006.01)

(52) U.S. Cl.
CPC .............. *G02B 6/4214* (2013.01); *G02B 6/43* (2013.01); *G02B 6/428* (2013.01); *G02B 6/4249* (2013.01); *G02B 6/4279* (2013.01)

(58) Field of Classification Search
CPC ...................................................... G02B 6/43
USPC ......................................................... 385/14
See application file for complete search history.

(56) References Cited

U.S. PATENT DOCUMENTS

| | | | |
|---|---|---|---|
| 6,343,171 B1 * | 1/2002 | Yoshimura et al. | 385/50 |
| 7,070,207 B2 * | 7/2006 | Asai | 385/14 |
| 7,072,535 B2 * | 7/2006 | Uchida | 385/14 |
| 7,248,757 B2 * | 7/2007 | Iwasaki | 385/14 |
| 7,444,041 B1 * | 10/2008 | Chen et al. | 385/14 |
| 2005/0276604 A1 * | 12/2005 | Morrow et al. | 398/73 |
| 2007/0053627 A1 * | 3/2007 | Hsu | 385/14 |
| 2007/0183719 A1 * | 8/2007 | Lee et al. | 385/47 |
| 2007/0297713 A1 * | 12/2007 | Lu et al. | 385/14 |
| 2008/0247703 A1 * | 10/2008 | Kodama et al. | 385/14 |
| 2008/0285910 A1 * | 11/2008 | Yamada et al. | 385/14 |
| 2010/0104246 A1 * | 4/2010 | Hodono | 385/88 |

FOREIGN PATENT DOCUMENTS

| | | |
|---|---|---|
| JP | 2004-235418 | 8/2004 |
| JP | 2008-152064 | 7/2008 |

* cited by examiner

*Primary Examiner* — Charlie Y Peng
(74) *Attorney, Agent, or Firm* — Rankin, Hill & Clark LLP

(57) ABSTRACT

There is provided an optical waveguide device. The device includes: a wiring substrate having a first opening portion therein and including: a substrate having an upper surface and a lower surface opposite to the upper surface; an upper side wiring layer formed on the upper surface of the substrate, and a lower side wiring layer formed on the lower surface of the substrate, an optical waveguide formed on the lower side wiring layer; a first optical element connected to the upper side wiring layer; a first circuit element electrically connected to the first optical element through the upper side wiring layer; a second optical element connected to the lower side wiring layer through the first opening portion; and a second circuit element electrically connected to the second optical element through the lower side wiring layer.

12 Claims, 8 Drawing Sheets

OPTICAL WAVEGUIDE DEVICE

This application claims priority from Japanese Patent Application No. 2012-277550, filed on Dec. 20, 2012, the entire contents of which are herein incorporated by reference.

BACKGROUND OF THE INVENTION

1. Technical Field

The present disclosure relates to an optical waveguide device.

2. Description of the Related Art

In recent years, core communication lines using an optical fiber communication technology have steadily been facilitated. In such a situation, the transmission speed of electric signals in electric devices and data terminals is becoming a bottleneck of an overall communication speed. In an attempt to eliminate such a bottleneck, an optoelectronic composite substrate, where optical signals are used for signal transmission to compensate for the limit of the transmission speed of the electric signals, has been proposed instead of a conventional electric circuit substrate where all the signal transmissions are electrically carried out.

In such an optoelectronic composite substrate, optical signals are transmitted using an optical waveguide configured of a core layer and a cladding layer that surrounds the core layer. In addition, light propagating through the core layer is reflected in a vertical direction by a light path changing mirror that is positioned at an end portion of the optical waveguide.

As an example of the optoelectronic composite substrate, JP-A-2004-235418 and JP-A-2008-152064 disclose that an electric wiring substrate is arranged on the optical waveguide and an optical element is optically coupled with the optical waveguide through an opening portion of the electric wiring substrate.

As explained in the introduction section for explaining the present invention (see later), a first light emitting element and a second light emitting element, which may be arranged on one end side of the optical waveguide, need to be connected to a first driver element and a second driver element, respectively. In this case, the first light emitting element is connected to the first driver element through an upper side wiring layer of the wiring substrate; and the second light emitting element is connected to the second driver element through a lower side wiring layer and a via conductor of the wiring substrate.

In such a structure, when electric signals are transmitted at a high speed, a transmission loss may be caused by, for example, reflection or the like that is caused by the via conductor, which makes a high speed signal transmission unfeasible.

In addition, in the wiring substrate having the via conductor, impedance mismatching may be caused in a transmission line, because dimensional accuracy in the width and thickness of a wiring layer formed by a non-electrolytic plating process tends to be decreased, so that a signal transmission characteristic is degraded.

SUMMARY OF THE INVENTION

An illustrative aspect of the present invention is to realize a favorable signal transmission characteristic in the optical waveguide device in which two optical elements are arranged on one end side of the optical waveguide, and each of the optical elements is connected to a corresponding circuit element through a wiring substrate.

According to one or more illustrative aspects of the present invention, there is provided an optical waveguide device. The device includes: a wiring substrate having a first opening portion therein and including: a substrate having an upper surface and a lower surface opposite to the upper surface; an upper side wiring layer formed on the upper surface of the substrate, and a lower side wiring layer formed on the lower surface of the substrate, an optical waveguide formed on the lower side wiring layer; a first optical element connected to the upper side wiring layer; a first circuit element electrically connected to the first optical element through the upper side wiring layer; a second optical element connected to the lower side wiring layer through the first opening portion; and a second circuit element electrically connected to the second optical element through the lower side wiring layer.

DETAILED DESCRIPTION

Embodiments according to the present invention will be now described with reference to the accompanying drawings.

Figure 1A:
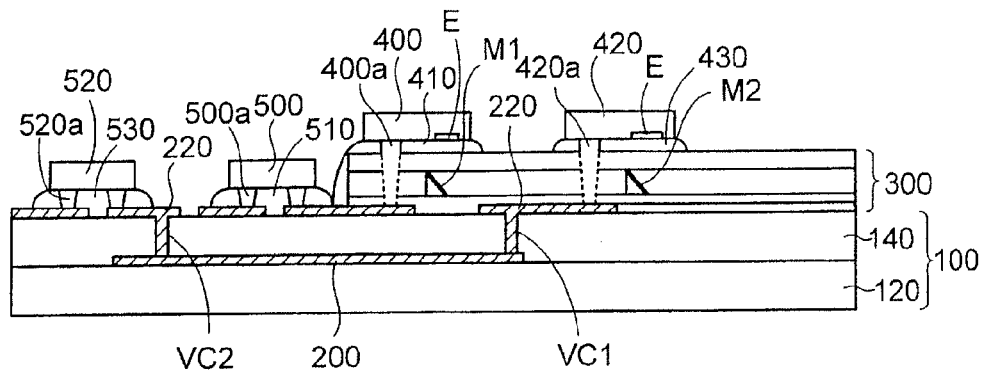
FIGS. 1A and 1B are a cross-sectional view and a plan view each illustrating an optical waveguide device according to the introduction section for explaining the present invention.

Before detailed description of embodiments according to the present invention is given, the introduction section for explaining the present invention will be now described for the better understanding of the features and advantages of the present invention. Referring to FIG. 1A, an optical waveguide 300 is arranged on a wiring substrate 100 in an optical waveguide device according to the introduction section. In the wiring substrate 100, a lower side wiring layer 200 is formed on a substrate 120.

On the substrate 120 and the lower side wiring layer 200, an interlayer insulating layer 140 made of an insulating resin is formed. An upper side wiring layer 220 is formed on the interlayer insulating layer 140. In the interlayer insulating layer 140, a first via conductor VC1 and a second via conductor VC2 are formed so as to penetrate through the interlayer insulating layer 140 in its thickness direction. The lower side wiring layer 200 and the upper side wiring layer 220 are electrically connected to each other through the first via conductor VC1 and the second via conductor VC2.

Figure 1B:
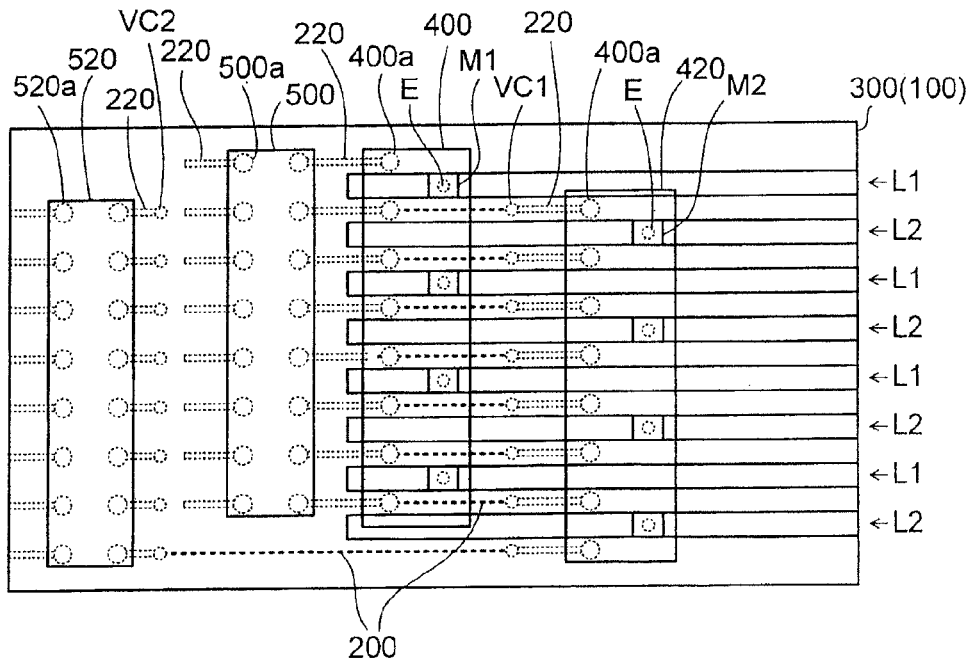

Referring to FIG. 1B, which is a plan view illustrating the optical waveguide device 300 of FIG. 1A, the optical waveguide device 300 is provided with plural first optical paths L1 and plural second optical paths L2. The first optical paths L1 and the second optical paths L2 are arranged alternately in parallel with one another.

Each of the first optical paths L1 is provided at a predetermined position with a first optical path changing mirror M1; and each of the second optical paths L2 is provided at a predetermined position with a second optical path changing mirror M2.

On the optical waveguide device 300, a first light emitting element 400 is arranged so as to be optically coupled with the first optical paths L1 of the optical waveguide device 300. On the optical waveguide device 300, a second light emitting element 420 is arranged so as to be optically coupled with the second optical paths L2 of the optical waveguide device 300.

Each of bump electrodes 400a of the first light emitting element 400 is connected to the upper side wiring layer 220 of the wiring substrate 100 through an opening portion of the optical waveguide 300. An underfill resin 410 is provided below the first light emitting element 400.

Similarly, each of bump electrodes 420a of the second light emitting element 420 is connected to the upper side wiring layer 220 of the wiring substrate 100 through an opening portion of the optical waveguide 300. An underfill resin 430 is provided below the second light emitting element 420.

The first light emitting element 400 and the second light emitting element 420 are provided with plural light emitting portions E. The light emitting portion E of the first light emitting element 400 is optically coupled with the first light path changing mirror M1 of the first optical path L1. The light emitting portion E of the second light emitting element 420 is optically coupled with the second light path changing mirror M2 of the second optical path L2.

Figure 2A:
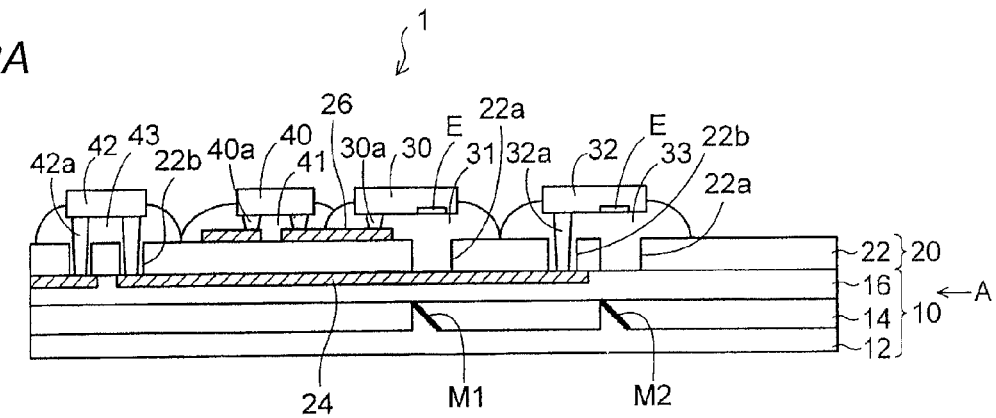
FIGS. 2A through 2C are a cross-sectional view, a plan view, and a side view each illustrating an optical waveguide device according to an embodiment of the present invention.
Figure 2B:
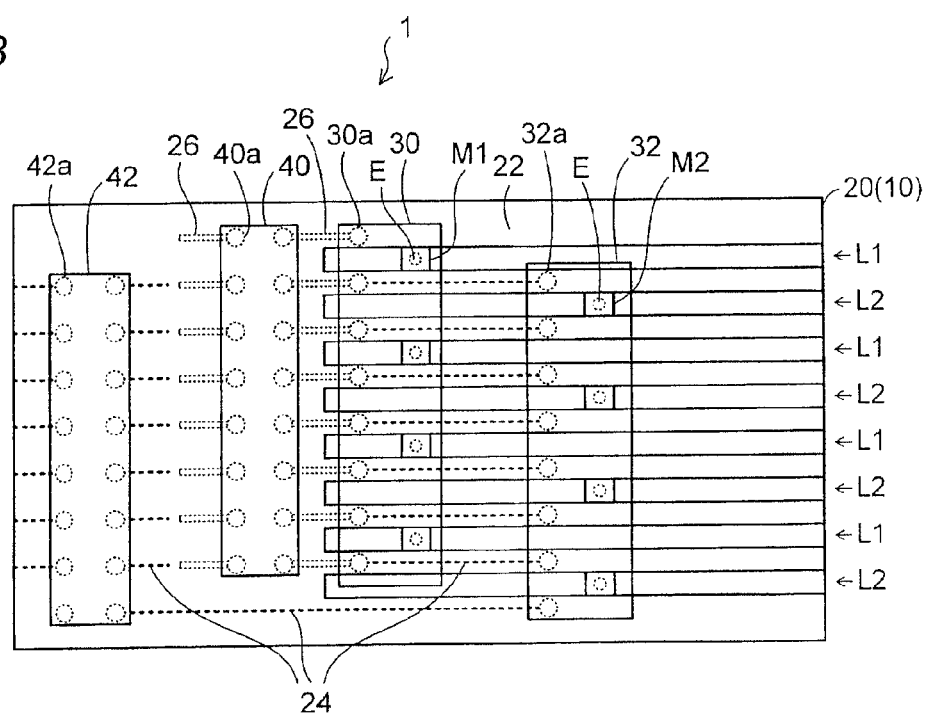

As illustrated in FIG. 2B, the light emitting portions E of the first light emitting element 400 and the light emitting portions E of the second light emitting element 420 are alternately arranged and optically coupled with the corresponding ones of the first optical paths L1 and the second optical paths L2.

Here, an arrangement pitch of the light emitting portion E of the first light emitting element 400 is, for example, about 250 µm. Therefore, when such a first light emitting element 400 is used in the optical waveguide 300, an arrangement pitch of the first light paths L1 of the optical waveguide 300 needs to be about 250 µm, and thus it is difficult to arrange the first light paths L1 at a pitch smaller than about 250 µm.

Therefore, the optical waveguide device according to the introduction section is configured such that each of the second optical paths L2 is arranged between two adjacent ones of the first optical paths L1 and the second light emitting element 420 is optically coupled with the second optical paths L2.

With this configuration, an arrangement pitch of combined optical paths of the first optical paths L1 and the second optical paths L2 is about 125 µm, which is half of the arrangement pitch of the light emitting portions E of the first light emitting element 400. As such, a pitch between the adjacent optical paths of the optical waveguide 300 can be reduced.

In addition, bump electrodes 500a of a first driver element 500 are connected to the upper side wiring layers 220 of the wiring substrate 100. An underfill resin 510 is provided below the first driver element 500. The first light emitting element 400 is electrically connected to the first driver element 500 through the upper side wiring layers 220.

Similarly, bump electrodes 520a of a second driver element 520 are connected to the upper side wiring layers 220 of the wiring substrate 100. An underfill resin 530 is provided below the second driver element 520. The second light emitting element 420 is electrically connected to the second driver element 520 through the upper side wiring layers 220, the first via conductors VC1, the lower side wiring layers 200, the second via conductors VC2, and the upper side wiring layers 220.

In the optical waveguide device according to the introduction section, the wiring substrate 100, which is a multi-layer wiring structure provided with the first via conductors VC1 and the second via conductors VC2, is used in order to electrically connect the first light emitting element 400 and the second light emitting element 420 with the first driver element 500 and the second driver element 520, respectively.

Because of such a configuration, in case of high speed transmission of the electric signals, a transmission loss is caused by, for example, reflection at the first and second via conductors VC1, VC2, which makes the high speed transmission becomes unfeasible.

The following technique is employed in order to form the first and second via conductors VC1, VC2 through the wiring substrate 100. First, via holes are formed through a substrate to reach the patterned upper side wiring layer 220. Then, the via holes are filled with a metal by a non-electrolytic plating process, thereby to form via conductors VC1, VC2, which makes it possible to electrically connect the upper side wiring layer 220 and the lower side wiring layer 200.

During the above non-electrolytic plating process, a surface of the upper side wiring layer 220 is also subjected to a non-electrolytic plating, which may change the width and thickness of the upper side wiring layer 220 and thus degrade dimension accuracy of the upper side wiring layer 220. This may cause impedance mismatching, which leads to degradation of a signal transmission characteristic.

The above explanation has been made with reference to a case where the light emitting elements 400, 420 are electrically connected to the driver elements 510, 520, respectively. A disadvantage associated with the above case may also occur in a case where a light receiver is connected to an amplifier.

Figure 2C:
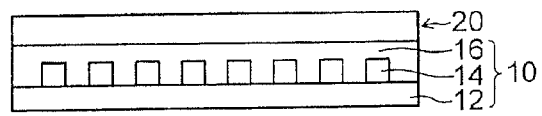

FIG. 2A is a cross-sectional view illustrating an optical waveguide device according to an embodiment; FIG. 2B is a plan view illustrating the optical waveguide device of FIG. 2A; and FIG. 2C is side view illustrating the optical waveguide device, as seen from a direction A of FIG. 2A. FIGS. 4A through 6C are cross-sectional views illustrating respective steps of producing the optical waveguide device according to the embodiment.

Figure 4A:
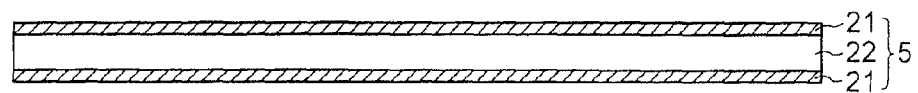
FIGS. 4A through 4D are cross-sectional views (Part 1) illustrating a method of producing an optical waveguide device according to an embodiment.
Figure 4B:
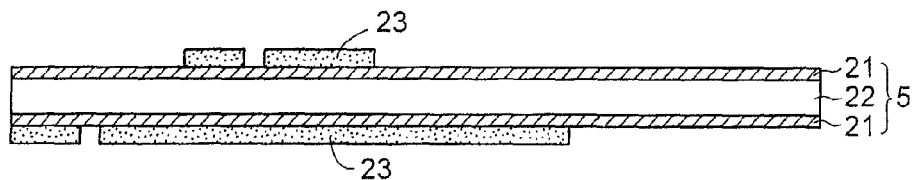
Figure 4C:
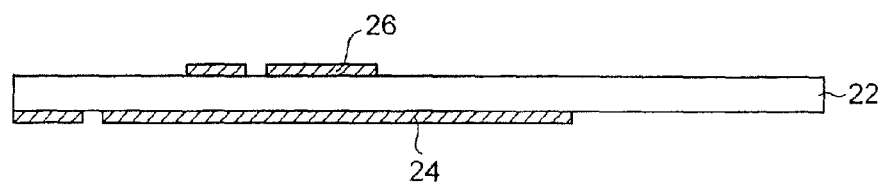

Referring to FIGS. 4A and 4C, a wiring substrate 20 is arranged on an optical waveguide 10 in an optical waveguide device 1. The optical waveguide 10 has a first cladding layer 12, a core layer 14 formed on the first cladding layer 12, and a second cladding layer 16 formed on the core layer 14. In other words, the optical waveguide 10 has a structure where the core layer 14 is surrounded by the first cladding layer 12 and the second cladding layer 16.

The reflection index of the core layer 14 is set to be higher than the reflection indices of the first cladding layer 12 and the second cladding layer 16.

FIG. 2B is a plan view schematically illustrating the optical waveguide device 1 of FIG. 2A. In an example illustrated in FIG. 2B, the core layer 14 is composed of four core layers L1 for a first optical path and four core layers L2 for a second optical path. Each of the optical paths L2 for the second optical path is placed between two adjacent ones of the optical layers L1 for the first optical path.

In other words, the core layers L1 for the first optical path and the core layers L2 for the second optical path are arranged alternately in parallel with one another on the wiring substrate 20.

As described later, a plurality of the core layer L1 for the first optical path are optically coupled with a first optical element; and a plurality of the core layer L2 for the second optical path are optically coupled with a second optical element.

Referring to FIGS. 2A and 2B, the core layers L1 for the first optical path are provided with corresponding first optical path changing mirrors M1 that are optically coupled with a first optical element 30. Similarly, the core layers L2 for the second optical path are provided with corresponding second optical path changing mirrors M2 that are optically coupled with a second optical element 32.

The wiring substrate 20 arranged on the optical waveguide 10 is provided with a substrate 22, a lower side wiring layer 24 formed on a lower surface of the substrate 22, and an upper side wiring layer 26 formed on an upper surface of the substrate 22. The substrate 22 includes opening portions 22a for light transmission, each of which is in an alignment with a corresponding one of the first and second optical path changing mirrors M1, M2. In addition, the substrate 22 includes opening portions 22b for electrical connection that allow the first and second optical elements 30, 32 to be electrically connected to the lower side wiring layer 24 of the wiring substrate 20. At bottoms of the opening portions 22b for electrical connection, predetermined portions of the lower side wiring layer 24 are exposed.

As the substrate 22, a flexible thin film material such as a polyimide film may be preferably used. Alternatively, a rigid substrate such as a glass epoxy substrate may be used.

In addition, each of bump electrodes 30a of the first optical element 30 is connected to the upper side wiring layer 26 of the wiring substrate 20. An underfill resin 31 is provided in the opening portions 22a for light transmission and a gap between the first optical element 30 and the wiring substrate 20. The first optical element 30 is optically coupled with the core layers L1 for the first optical path through the opening portions 22a for light transmission.

Moreover, each of bump electrodes 32a of the second optical element 32 are connected to the lower side wiring layer 24 at bottoms of the opening portions 22b for electrical connection of the wiring substrate 20. An underfill resin 33 is provided in the opening portions 22a for light transmission and a gap between the second optical element 32 and the wiring substrate 20. The second optical element 32 is optically coupled with the core layers L2 for the second optical path through the opening portions 22a for light transmission.

In FIG. 2B (a plan view), the lower side wiring layers 24 are illustrated by bold broken lines, but omitted around a first circuit element 40 for the convenience of illustration. In addition, the opening portions 22a for light transmission, the opening portions 22b for electrical connection, the underfill resin 31 below the first optical element 30, and the underfill resin 33 below the second optical element 32, which are illustrated in FIG. 2A, are omitted in FIG. 2B.

The first and second optical elements 30, 32 are the same element, and either one of a light emitting element and a light receiving element. As a light emitting element, a vertical cavity surface emitting laser (VCSEL) may be preferably used. As a light receiving element, a photodiode may be preferably used.

In the following, the optical waveguide device 1, which uses the first and second optical elements 30, 32 as light emitting elements, will be described in this embodiment of the present invention. Referring to FIGS. 2A and 2B, the first and second light emitting elements 30, 32 serving as the light emitting elements are provided with plural light emitting portions E. The light emitting portions E of the first optical element 30 are optically coupled with the corresponding first light path changing mirrors M1 provided for the corresponding core layers L1 for the first optical path.

In this case, an arrangement pitch of the respective light emitting portions E of the first optical element 30 is around 250 μm, as explained in the introduction section. Therefore, when the first optical element 30 having the plural light emitting portions E is used, an arrangement pitch of the respective core layers L1 for the first optical path is also around 250 μm, and thus it is difficult to make the arrangement pitch smaller than this.

For this reason, the core layers L2 for the second optical path are arranged between the adjacent core layers L1 for the first optical path in this embodiment. In addition, the light emitting portions E of the second optical element 32 are optically coupled with the corresponding second light path changing mirrors M2 provided for the corresponding core layers L2 for the second optical path.

In such a manner, the core layers L1 for the first optical path, which are optically coupled with the first optical element 30, and the core layers L2 for the second optical path, which are optically coupled with the second optical element 32, are arranged alternately in parallel with each other on the same level. Thus, an arrangement pitch of respective optical paths can be reduced by half as compared to the arrangement pitch of the light emitting portions E of the first optical element 30, which makes it possible to increase the integration density and to reduce the size of the optical waveguide device 1.

When the first and second optical elements 30, 32 are the light receiving elements, the first optical element 30 is arranged so that the plural light detecting portions of the first optical element 30 are optically coupled with the corresponding core layers L1 for the first optical path. In addition, the second optical element 32 is arranged so that the plural light detecting portions of the second optical element 32 are optically coupled with the corresponding core layers L2 for the second optical element that are arranged between the adjacent core layers L1 for the first optical path.

In addition, bump electrodes 40a of the first circuit element 40 are connected to the upper side wiring layer 26 of the wiring substrate 20. An underfill resin 41 is provided in a gap between the first circuit element 40 and the wiring substrate 20. With such a configuration, the first optical element 30 is electrically connected to the first circuit element 40 through the upper side wiring layer 26 of the wiring substrate 20.

In addition, bump electrodes 42a of the second circuit element 42 are connected to the lower side wiring layer 24 through the opening portions 22b. An underfill resin 43 is provided in the opening portions 22b and a gap between the second circuit element 42 and the wiring substrate 20. With such a configuration, the second optical element 32 is electrically connected to the second circuit element 42 through the lower side wiring layer 24 of the wiring substrate 20.

In FIG. 2A (a plan view), the underfill resins 41, 43 provided below the first and second circuit elements 40, 42, and the opening portions 22b are omitted.

When the first and second optical elements 30, 32 are the light emitting elements, driver elements may be used as the first and second circuit elements 40, 42. On the other hand, when the first and second optical elements 30, 32 are the light receiving elements, amplifier elements (transimpedance amplifier or the like) may be used as the first and second circuit elements 40, 42.

As described above, in the optical waveguide device 1 according to this embodiment, the wiring substrate 20 is provided with no via conductors. Instead, the second optical element 32 and the second circuit element 42 are directly connected to the lower side wiring layer 24 through the opening portions 22b.

Therefore, a transmission loss due to reflection of electrical signals caused at the via conductors at the time of high speed signal transmissions can be reduced, thereby to realize high speed, high quality signal transmissions.

In addition, the lower side wiring layer 24 and the upper side wiring layer 26 may be obtained by photolithographiclly patterning, for example, copper foils that are formed on both sides of the substrate 22 with high thickness accuracy, instead of employing a plating process. Therefore, variability in the width and thickness of the lower side wiring layer 24 and the upper side wiring layer 26 is reduced thereby to improve dimension accuracy, which allows for impedance matching in a transmission path.

In addition, the first optical element 30 and the second optical element 32 are arranged in a longitudinal direction of the core layer 14 (L1, L2) (see FIG. 2B). Because of this, the light emitting portions E of the first optical element 30 are arranged alternately with the light emitting portions E of the second optical element 32, so that the light emitting portions E of the first and second optical elements 30, 32 can be optically coupled with the corresponding core layers L1, L2. Therefore, the core layers L1, L2 can be arranged alternately in parallel with each other at half of the arrangement pitch of the light emitting portions E of the first optical element 30 (or the second optical elements 32).

Figure 3A:
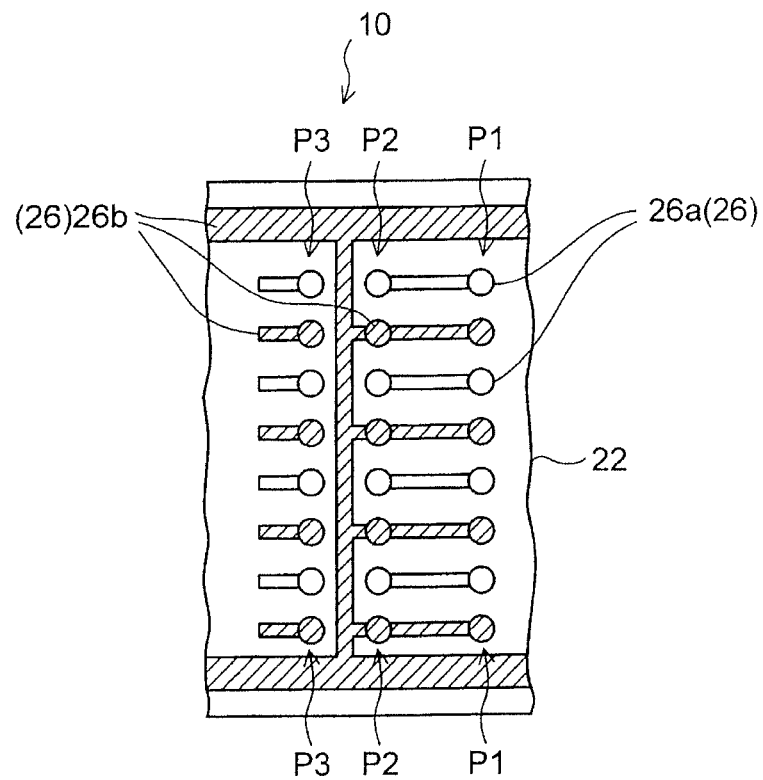
FIG. 3A is a plan view illustrating an example of a layout of an upper side wiring layer in a wiring substrate of the optical waveguide device of FIG. 2A.

FIG. 3A is a plan view of an example of a layout of the upper side wiring layer 26 of the wiring substrate 20. As illustrated in FIG. 3A, the upper side wiring layer 26 includes signal line wiring layers 26a, which are drawn without hatching, and ground line wiring layers 26b, which are drawn with hatching.

Referring to FIG. 2A in addition to FIG. 3A, first connection pads P1, which are provided for the signal line wiring layers 26a and the ground line wiring layers 26b, are connected to the bump electrodes 30a of the first optical element 30. In addition, second connection pads P2 and third connection pads P3, which are provided for the signal line wiring layers 26a and the ground line wiring layers 26b, are connected to the bump electrodes 40a of the first circuit element 40.

With such a configuration, the first optical element 30 is electrically connected to the first circuit element 40 through the upper side wiring layer 26.

Figure 3B:
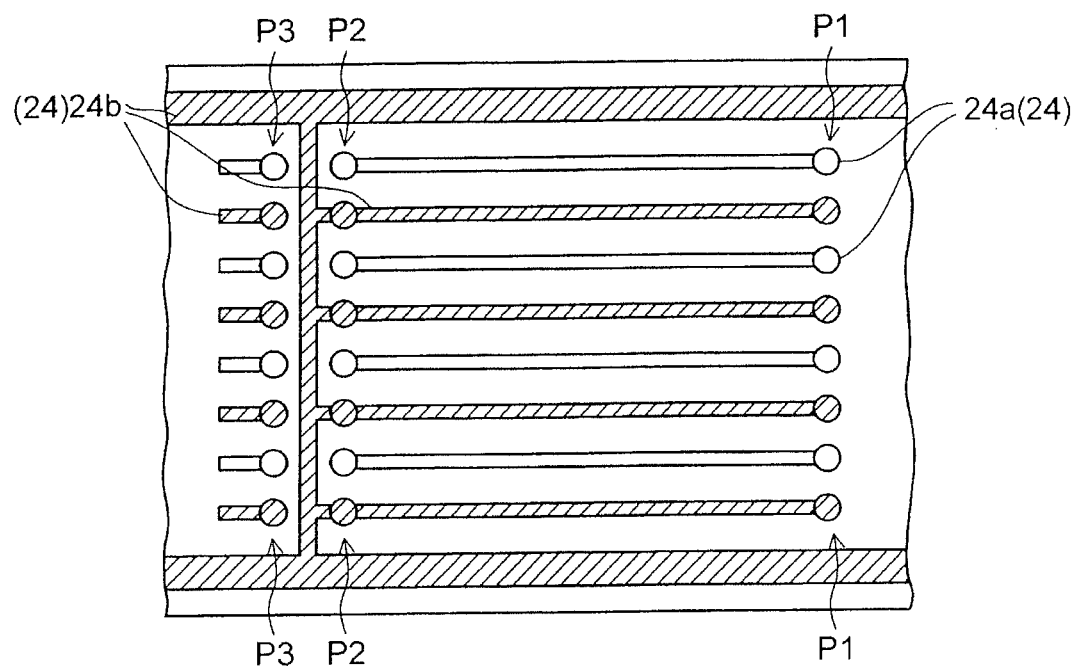
FIG. 3B is a plan view illustrating an example of a layout of a lower side wiring layer in the wiring substrate of the optical waveguide device of FIG. 2A.

In addition, referring to FIG. 3B, which is a plan view of an example of a layout of the lower side wiring layer 24 of the wiring substrate 20, the lower side wiring layer 24 includes signal line wiring layers 24a, which are drawn without hatching, and ground line wiring layers 24b, which are drawn with hatching.

Referring to FIG. 2A in addition to FIG. 3B, first connection pads P1, which are provided for the signal line wiring layers 24a and the ground line wiring layers 24b, are connected to the bump electrodes 32a of the second optical element 32. In addition, second connection pads P2 and third connection pads P3, which are provided for the signal line wiring layers 24a and the ground line wiring layers 24b, are connected to the bump electrodes 42a of the second circuit element 42.

With such a configuration, the second optical element 32 is electrically connected to the second circuit element 42 through the lower side wiring layer 24.

Next, optical propagation in the optical waveguide device 1 according to this embodiment will be explained with reference to FIG. 2A. When the first and second optical elements 30, 32 are the light emitting elements, the first and second circuit elements 40, 42 are the driver elements. In this case, electric signals output from the first and second circuit elements 40, 42 are supplied to the first and second optical elements 30, 32, respectively, and thus light is emitted in a downward direction concurrently from the light emitting portions E of the first and second optical elements 30, 32.

The light emitted from the first optical element 30 transmits through the underfill resin 31 and the second cladding layer 16 in this order, and reaches the core layer L1 for the first optical path (the core layer 14). Then, the light is reflected by the first optical path changing mirror M1 in the core layer L1 for the first optical path (the core layer 14), so that optical paths are changed by 90 degrees, and thus coupled with the core layer L1 for the first optical path (the core layer 14).

Similarly, the light emitted from the second optical element 32 transmits through the underfill resin 33 and the second cladding layer 16 in this order, and reaches the core layer L2 for the second optical path (the core layer 14). Then, the light is reflected by the second optical path changing mirror M2 in the core layer L2 for the second optical path (the core layer 14), so that optical paths are changed by 90 degrees, and thus coupled with the core layer L2 for the second optical path (the core layer 14).

Next, the light entering the core layer 14 travels in the core layer 14 while repeating total reflections. Then, the light is reflected by another one of the first (or second) optical path changing mirror M1 (or M2), which is provided in the other end of the core layer 14, so that the light enters a light receiving element. Alternatively, when the core layer 14 is provided at the other end with a connecter, the light propagating through the core layer 14 enters an external optical fiber or the like connected to the connecter.

When the first and second optical elements 30, 32 are the light receiving elements, the first and second circuit elements 40, 42 are used as the amplifier elements. In this case, the light propagates in an optical route that is opposite to the above-described route, and enters light detecting portions of the light receiving elements. Then, the light receiving elements converts light signals into electric signals, which then are supplied to the amplifier elements.

Next, a method of producing the optical waveguide device according to an embodiment of the present invention will be now described. Referring to FIG. 4A, a stacked layer body 5 is firstly prepared. The stacked layer body 5 includes a substrate 22 and copper foils 21 attached on both surfaces of the substrate 22. The substrate 22 may be formed of, for example, a flexible material such as a polyimide film, and has a thickness of preferably 10 μm to 30 μm (specifically, around 20 μm). The copper foil 21 have a thickness of preferably 5 μm to 20 μm (specifically, around 9 μm).

An in-plane variability of the thickness of the copper foils 21 is in a range of −10% to +10%, which indicates that thickness accuracy of the copper foils 21 is better than that of a copper layer made by a plating process.

Although the copper foils 21 are used as an example of a metal layer in this embodiment, a metal foil formed of other metals can be used in other embodiments, as long as the metal foil can provide the wiring layers.

Next, referring to FIG. 4B, photoresist patterns 23 for forming the lower side wiring layer 24 and the upper side wiring layer 26 are formed on both sides of the stacked layer body 5 by a photolithography method.

Then, the copper foils 21 are wet-etched by using the photoresist patterns 23 on both sides of the stacked layer body 5. As an etchant, a cupric chloride aqueous solution, a ferric chloride aqueous solution, or the like may be used. After the wet-etching, the residual photoresist patterns 23 are removed.

With this, the lower side wiring layer 24 is formed on a lower surface of the substrate 22; and the upper side wiring layer 26 is formed on an upper side of the substrate 22, as illustrated in FIG. 4C.

Figure 4D:
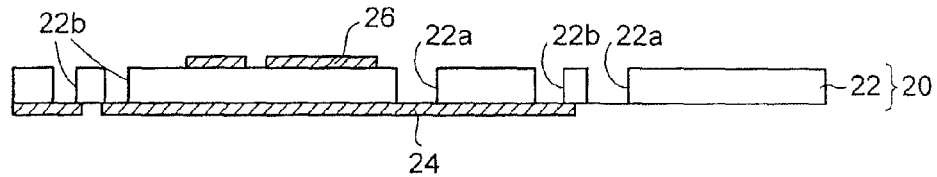

Subsequently, as shown in FIG. 4D, the opening portions 22a for light transmission, which pass through the substrate 22, are formed. The opening portions 22a allow the first and second optical elements 30, 32 to be optically coupled with the optical waveguide 10 (see FIG. 2A). The opening portions 22a for light transmission may be made by, for example, a laser beam drilling method. In addition, the opening portions 22b for electrical connection, which pass through the substrate 22, are formed. The opening portions 22b for electrical connection allow the second optical element 32 (FIG. 2A) to be connected to the second circuit element 42 (FIG. 2A) through the lower side wiring layer 24. The opening portions 22b for electrical connection may be formed by, for example, the laser beam drilling method, preferably in the same process as that for forming the opening portions 22a for light transmission.

Figure 5A:
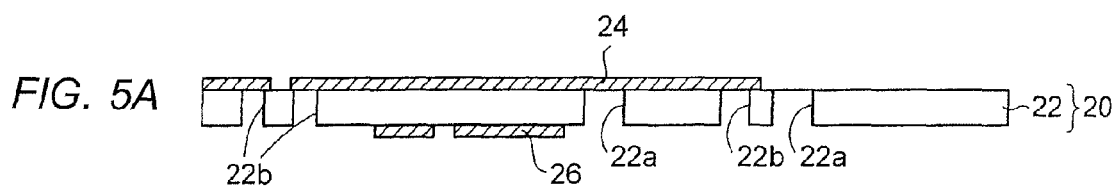
FIGS. 5A through 5D are cross-sectional views (Part 2) illustrating the method of producing the optical waveguide device according to the embodiment.

Next, as shown in FIG. 5A, the wiring substrate 20 of FIG. 4D is vertically flipped. Then, a photosensitive resin layer (not illustrated) for forming the second cladding layer 16 is formed on the substrate 22 to cover the lower side wiring layer 24. The photosensitive resin layer is exposed to an exposure light by employing the photolithography method. After the exposed photosensitive resin layer is developed, the developed photosensitive resin layer is cured at a temperature of 100° C. to 140° C. by a heating treatment.

Figure 5B:
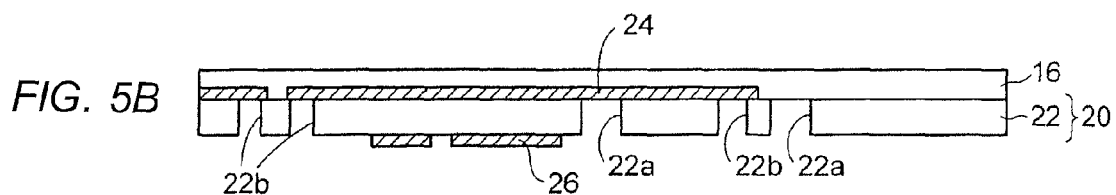

Thus, the second cladding layer 16 is formed on the substrate 22 and the lower side wiring layer 24, as illustrated in FIG. 5B. The thickness of the second cladding layer 16 is set to be, for example, 10 μm to 30 μm.

In the above process, as a photosensitive resin for forming the photosensitive resin layer, an ultraviolet cure epoxy resin or the like may be preferably used. The photosensitive resin layer may be formed by affixing a half-cured (B-stage) photosensitive resin sheet or applying a liquid photosensitive resin.

The core layer 14 and the first cladding layer 12, which will be explained later, may be formed favorably with the same or similar photosensitive resin.

Subsequently, another photosensitive resin layer (not illustrated) for forming the core layer 14 is formed on the second cladding layer 16. Then, this photosensitive resin layer is exposed to an exposure light by employing a photolithography method. After the exposed photosensitive resin layer is developed, the developed photosensitive resin layer is cured at a temperature of 100° C. to 140° C. by a heating treatment.

Figure 5C:
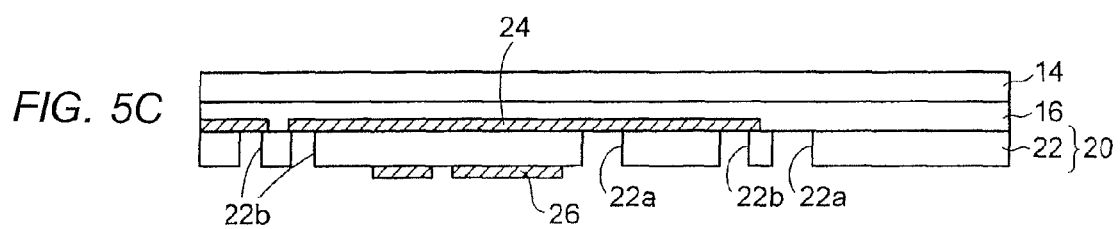

With this, the core layer 14 is formed on the second cladding layer 16, as illustrated in FIG. 5C. The core layer 14 has a top view shape of plural strip-shaped patterns (see FIG. 2B, for example). Specifically, the core layer 14 includes the core layers L1 for the first optical path and the core layers L2 for the second optical path, each of which is arranged between the two adjacent core layers L1 for the first optical path, as described above.

Figure 5D:
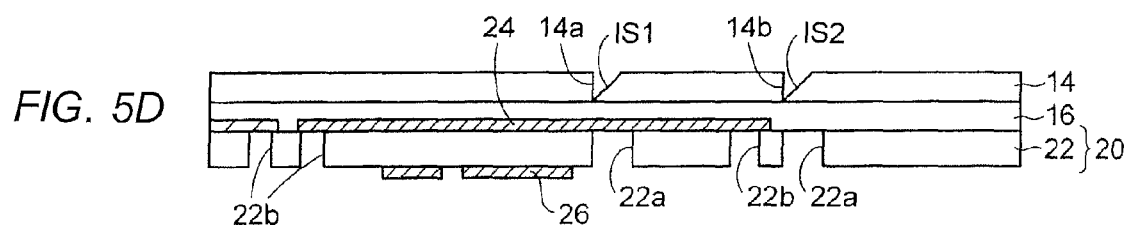

Next, as shown in FIG. 5D, first groove portions 14a, each of which is formed in a V-shape, are formed in the core layer 14 (specifically, in the core layer L1 for the first optical path (FIG. 2B)). In order to form the first groove portions 14a, a laser processing apparatus may be used so that predetermined portions of the core layer 14 are processed. Each of the first groove portions 14a includes a first inclined surface IS1 for changing an optical path.

In addition, second groove portions 14b, each of which is formed in a V-shape, are formed in the core layer 14 (specifically, in the core layer L2 for the second optical path (FIG. 2B)). The second groove portions 14b may be formed in the same process as that for forming the first groove portions 14a. Each of the second groove portions 14b includes a second inclined surface IS2 for changing an optical path. The first and second inclined surfaces IS1, IS2 are preferably inclined at 45° with respect to the wiring substrate 20.

Figure 6A:
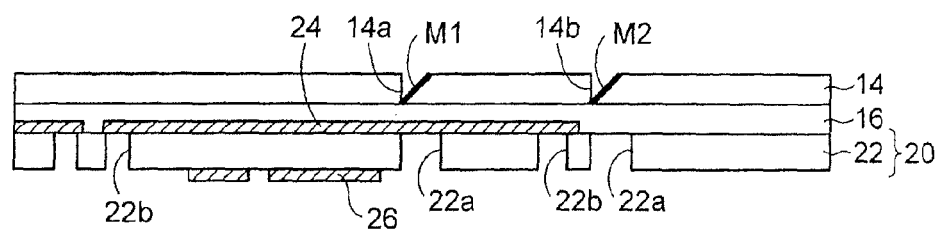
FIGS. 6A through 6C are cross-sectional views (Part 3) illustrating the method of producing the optical waveguide device according to the embodiment.

Next, as shown in FIG. 6A, the first optical path changing mirror M1 and the second optical path changing mirror M2 are formed on the first inclined surface IS1 and the second inclined surface IS2 (FIG. 5D), respectively. The first (or second) optical path changing mirror M1 (or M2) is formed partially on the first (or second) inclined surface IS1 (or IS2) by depositing a light-reflective metal. As a light-reflective metal, gold, aluminum, or the like can be used.

The first and second optical path changing mirrors M1, M2 may be formed in the following manner in other embodiments. First, transparent optical parts are prepared. The transparent optical parts have a shape of preferably a right-angled triangular prism, and a metal layer is formed on an inclined surface of the right-angled triangular prism. Then, the optical parts are embedded in predetermined positions of the core layer 14 before the core layer 14 is completely cured. With this, the metal layers of the optical parts embedded in the core layer 14 can serve as optical path changing mirrors.

Subsequently, yet another photosensitive resin layer (not illustrated) for forming the first cladding layer 12 is formed on the second cladding layer 16 and the core layer 14. Then, this photosensitive resin layer is exposed to an exposure light by employing a photolithography method. After the exposed photosensitive resin layer is developed, the developed photosensitive resin layer is cured at a temperature of 100° C. to 140° C. by a heating treatment.

Figure 6B:
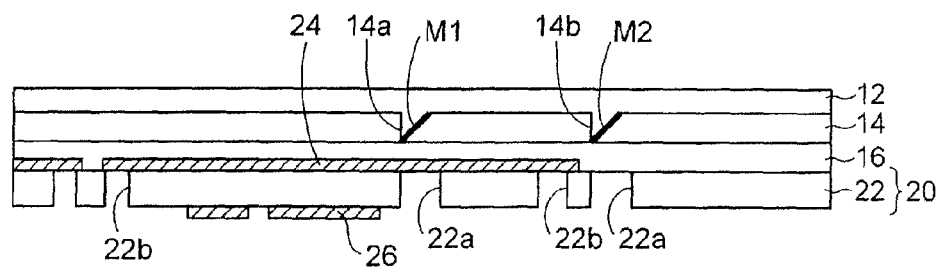

With this, the first cladding layer 12 that covers the core layer 14 is formed on the second cladding layer 16, as illustrated in FIG. 6B. The first cladding layer 12 is filled into gaps between the core layers 14 (the core layers L1 for the first optical path and the core layers L2 for the second optical path), and the first and second grooves 14a, 14b, so that an upper surface of the first cladding layer 12 becomes flat. The thickness of the first cladding layer 12 on the core layer 14 is set to be, for example, 10 μm to 30 μM.

Figure 6C:
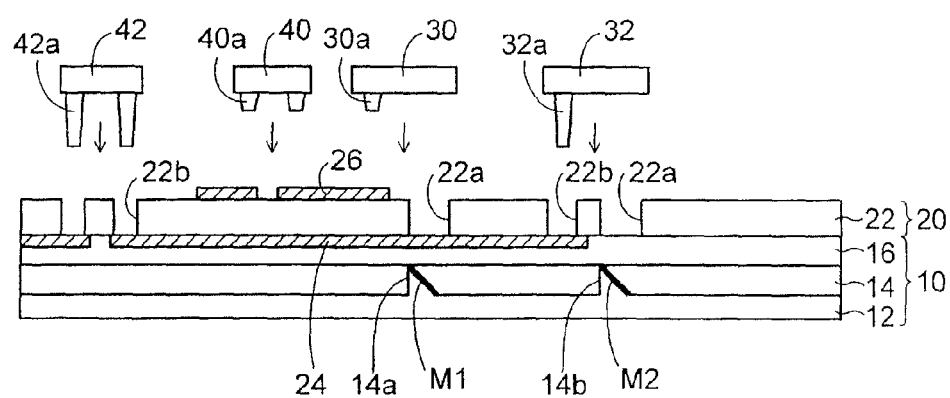

Then, the optical waveguide device in progress illustrated in FIG. 6B is vertically flipped, as illustrated in FIG. 6C. Next, the bump electrodes 30a of the first optical element 30 are connected with solder or the like to the upper side wiring layer 26 of the wiring substrate 20. In addition, the bump electrodes 32a of the second optical element 32 are connected with solder or the like to the lower side wiring layer 24 through corresponding opening portions 22b for electrical connection.

Moreover, the bump electrodes 40a of the first circuit element 40 are connected with solder or the like to the upper side wiring layer 26 of the wiring substrate 20. Furthermore, the bump electrodes 42a of the second circuit element 42 are connected with solder or the like to the lower side wiring layer 24 through the corresponding opening portions 22b for electrical connection.

In such a manner, the first optical element 30 and the first circuit element 40 are electrically connected with each other through the upper side wiring layer 26. In addition, the second optical element 32 is connected to the lower side wiring layer 24 through the opening portions 22b for electrical connection, and thus the second optical element 32 and the second circuit element 42 are electrically connected with each other through the lower side wiring layer 24.

Incidentally, the underfill resins 31, 33, 41, 43 (FIG. 2A), which are provided below the first optical element 30, the second optical element 32, the first circuit element 40, and the second circuit element 42, respectively, may be made at a given time, or separately after each of the elements is mounted.

With all the above processes, the optical waveguide device 1 according to this embodiment of FIGS. 2A and 2B can be produced.

Incidentally, the optical waveguide device according to the present invention can be produced by other methods than the method described above. As an example of the other methods, there is a following one. First, an optical waveguide is formed on a tentative substrate, and then the optical waveguide is removed from the tentative substrate, thereby to obtain the optical waveguide 10 (FIG. 2A, for example). Next, the obtained optical waveguide 10 is attached onto the wiring substrate 20 of FIG. 5A, thereby to obtain the optical waveguide device 1 (FIG. 2A). Namely, the optical waveguide device 1 may be formed by forming the optical waveguide 10 on the wiring substrate 20 in a step-by-step manner, or by attaching the optical waveguide 10, which has been prepared separately, onto the wiring substrate 20.

In the method of producing the optical waveguide device according to the embodiments of the present invention, the upper side wiring layer 24 and the lower side wiring layer 26 are formed by patterning the corresponding copper foils 21, which has high thickness accuracy in accordance with the photolithography and wet-etching technique.

Therefore, impedance matching in the transmission lines can easily be realized, because variability in the width and thickness of the lower side wiring layer 26 and the upper side wiring layer 24 can be reduced, compared with a case where these layers are formed by a plating method. As a result, transmission losses of signals can be reduced, thereby to obtain excellent signal transmission characteristics.

Figure 7:
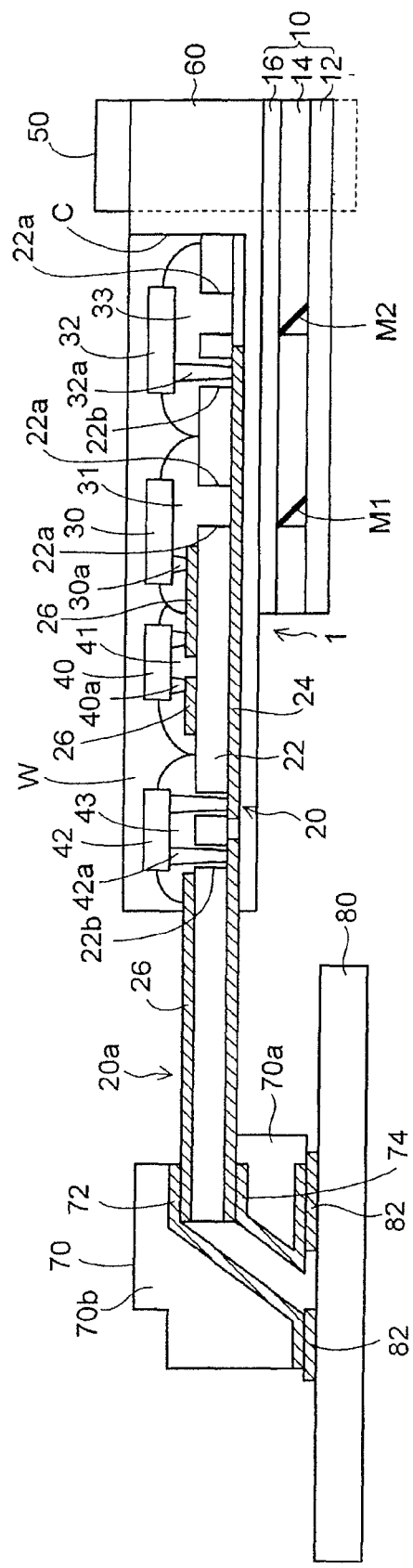
FIG. 7 is a cross-sectional view illustrating an example where an optical waveguide device is connected to an electronic substrate.

Next, an explanation will be given about a case where the optical waveguide device 1 according to the above embodiments is connected to an electronic substrate such as a mother board, with reference to FIG. 7. First, a transparent case 60 is prepared. The transparent case 60 may be formed of glass or the like. In addition, the transparent case 60 has two wall portions W that oppose each other, and openings on one end side and the upper side thereof, so that a cavity C is formed inside the transparent case 60. As illustrated in FIG. 7, the optical waveguide device 1 of FIG. 2A is placed in the cavity C of the transparent case 60.

In addition, a connector 50 for optical connection is provided at the other end side of the transparent case 60. An external optical fiber (not illustrated) is aligned and connected to the connector 50 so as to be optically connected to the optical waveguide 10.

The wiring substrate 20 of the optical waveguide device 1 includes an extension portion 20a that extends outward from a front end of the transparent case 60. The extension portion 20a of the wiring substrate 20 is connected to a flexible connector 70. The flexible connector 70 includes a lid portion 70b that is movable, and a supporting portion 70a. The extension portion 20a of the wiring substrate 20 is arranged on the supporting portion 70a of the flexible connector 70, and the lid potion 70b is attached to the supporting portion 70a, so that the wiring substrate 20 and the flexible connector 70 are connected.

A first wiring layer 72 and a second wiring layer 74 of the flexible connector 70 are connected to the upper side wiring layer 26 and the lower side wiring layer 24 of the extension portion 20a of the wiring substrate 20, respectively.

Moreover, the first wiring layer 72 and the second wiring layer 74 of the flexible connector 70 are connected to wiring layers 82 of the electronic substrate 80, respectively.

In such a manner, the optical waveguide device 1 according to this embodiment is housed in the transparent case 60, and the wiring substrate 20 is electrically connected to the electronic substrate 80 such as the mother board through the flexible connector 70.

Here, as a comparative example, a case where the optical waveguide device explained in the introduction section with reference to FIG. 1A is connected to an electronic substrate such as a mother board is mentioned. In the optical waveguide device of FIG. 1A, additional via conductors connected to the lower side wiring layer 200 are provided in the substrate 120, although the via conductors are not illustrated in the drawing. In addition, solder balls serving as external connection terminals are mounted on the lower surface of the substrate 120.

Then, the optical waveguide device of FIG. 1A is electrically connected to the electronic substrate through the additional via conductors and the solder balls. In this comparative example, because the solder balls exist in a signal transmission line, it is difficult to match impedance of the signal transmission line, so that an efficient signal transmission becomes difficult.

However, because the optical waveguide device 1 illustrated in FIG. 7 can be connected to the electronic substrate by connecting the wiring layers formed of copper or the like, without using the solder balls, it is easy to match impedance of the signal transmission line, thereby to realize an efficient signal transmission.

Next, an explanation will be given about another case where the optical waveguide device 1 according to the embodiment is connected to an electronic substrate such as a mother board, with reference to FIG. 8.

Figure 8:
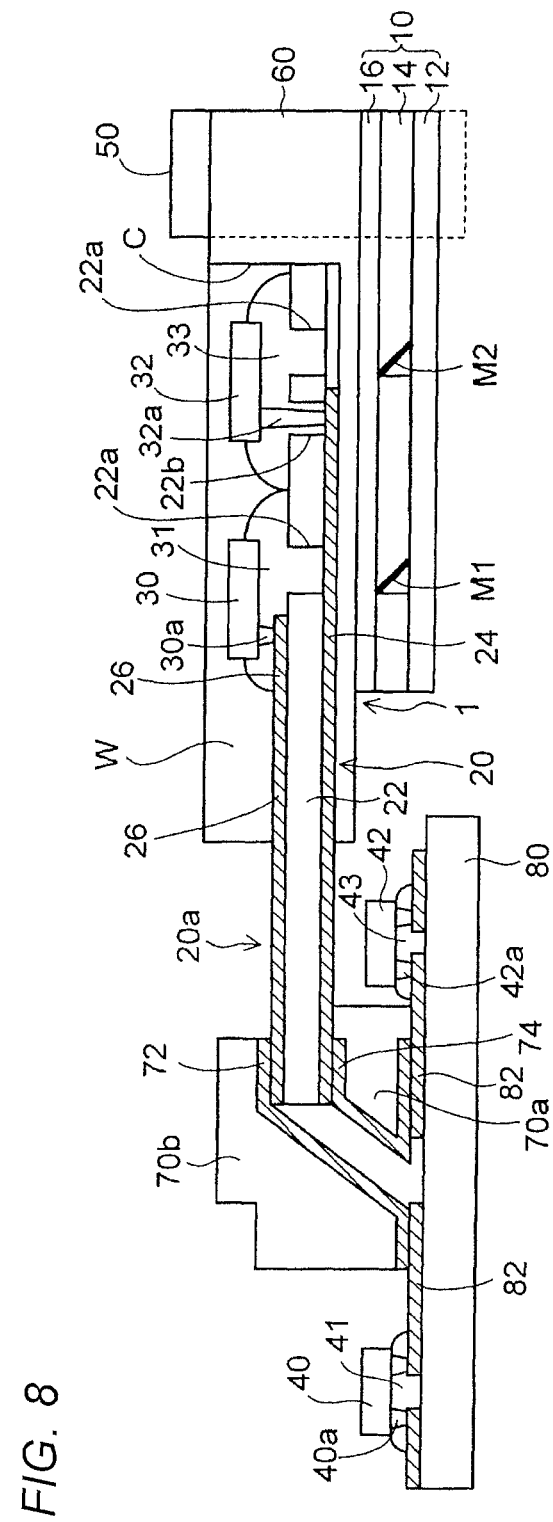
FIG. 8 is a cross-sectional view illustrating another example where the optical waveguide device is connected to an electronic substrate.

The optical waveguide device 1 and the electronic substrate 80 that are electrically connected with each other in FIG. 8 are different from those in FIG. 7 in that the first circuit element 40 and the second circuit element 42 are arranged on the electronic substrate 80 rather than inside the optical waveguide device 1. Because other elements, layers, portions, and the like in FIG. 8 are the same as those in FIG. 7, the same reference numerals and sings are given to the same elements, layers, portions, and the like as those in FIG. 7, and repetitive explanations are omitted.

The first optical element 30 is electrically connected to the bump electrodes 40a of the first circuit element 40 through the upper side wiring layer 26 of the wiring substrate 20, the first wiring layer 72 of the flexible connecter 70, and the wiring layer 82 of the electronic substrate 80.

In addition, the second optical element 32 is electrically connected to the bump electrodes 42a of the second circuit element 42 through the lower side wiring layer 24 of the wiring substrate 20, the second wiring layer 74 of the flexible connecter 70, and the wiring layer 82 of the electronic substrate 80.

As described above, the first circuit element 40 and the second circuit element 42 may be arranged on the electronic substrate 80 such as a mother board, which is an outside member of the optical waveguide device 1. In addition, the first circuit element 40 arranged on the electronic substrate 80 is electrically connected to the first optical element 30 in the wiring substrate 20 through the upper side wiring layer 26 and the like; and the second circuit element 42 arranged on the electronic substrate 80 is electrically connected to the second optical element 32 in the wiring substrate 20 through the lower side wiring layer 24 and the like.

It may as well be mentioned that the optical waveguide device of FIG. 8 is configured to include the flexible connector 70 and the electronic substrate 80 on which the first circuit element 40 and the second circuit element 42 are arranged.

Even in the optical waveguide device of FIG. 8, because no solder balls are used, it is easy to match the impedance in the signal transmission line, which enables an efficient signal transmission.

Various aspects of the subject matter described herein are set out non-exhaustively in the following numbered clauses:

1. A method of producing an optical waveguide device, the method comprising:

(a) preparing a substrate having an upper surface and a lower surface opposite to the upper surface, wherein metal layers are formed on the upper surface and the lower surface of the substrate, respectively;

(b) patterning the metal layer formed on the upper surface to form an upper side wiring layer and patterning the metal layer formed on the lower surface to form a lower side wiring layer;

(c) forming a first opening portion through the substrate;

(d) forming an optical waveguide on the lower side wiring layer; and (e) providing a first optical element, a first circuit element, a second optical element and a second circuit element such that: the first optical element and the first circuit element are electrically connected with each other through the upper side wiring layer; the second optical element is connected to the lower side wiring layer through the first opening portion; and the second optical element and the second circuit element are electrically connected to each other through the lower side wiring layer.

2. The method of clause 1,
wherein the step (d) comprises:
forming the optical waveguide which comprises: a plurality of first core layers for first optical paths; and a plurality of second core layers for second optical paths, wherein the first core layers and the second core layers are alternatively arranged on the same level,
wherein the step (e) comprises:
providing the first optical element such that the first optical element is optically coupled with the respective first core layers; and
providing the second optical element such that the second optical element is optically coupled with the respective second core layers.

3. The method of clause 1, wherein the step (e) comprises: disposing the first circuit element on the upper side wiring layer.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. An optical waveguide device comprising:
a wiring substrate comprising:
a substrate having an upper surface and a lower surface opposite to the upper surface, the first opening portion passing through the substrate;
an upper side wiring layer formed on the upper surface of the substrate; and
a lower side wiring layer formed on the lower surface of the substrate, an optical waveguide formed on the lower side wiring layer;
a first optical element connected to the upper side wiring layer;
a first circuit element electrically connected to the first optical element through the upper side wiring layer;
a second optical element connected to the lower side wiring layer through the first opening portion; and
a second circuit element electrically connected to the second optical element through the lower side wiring layer,
wherein the optical waveguide comprises:
a plurality of first core layers for first optical paths; and
a plurality of second core layers for second optical paths, wherein the first core layers and the second core layers are alternatively arranged on a same level,
wherein the first optical element is optically coupled with the respective first core layers, and
wherein the second optical element is optically coupled with the respective second core layers.

2. The optical waveguide device of claim 1,
wherein the substrate is further formed with a second opening portion and a third opening portion, and
wherein the first optical element is optically coupled with the optical waveguide through the second opening portion, and the second optical element is optically coupled with the optical waveguide through the third opening portion.

3. The optical waveguide device of claim 1,
wherein the first circuit element is disposed on the upper side wiring layer.

4. The optical waveguide device of claim 1,
wherein the upper side wiring layer and the lower side wiring layer are connected to an electronic substrate through a connector.

5. The optical waveguide device of claim 1,
wherein the upper side wiring layer and the lower side wiring layer are connected to an electronic substrate through a connector, and
wherein the first circuit element and the second circuit element are arranged on the electronic substrate.

6. The optical waveguide device of claim 1,
wherein the first optical element and the second optical element are configured as light emitting elements, and
wherein the first circuit element and the second circuit element are configured as driver elements.

7. The optical waveguide device of claim 1,
wherein the first optical element and the second optical element are configured as light receiving elements, and
wherein the first circuit element and the second circuit element are configured as amplifier elements.

8. The optical waveguide device of claim 1, wherein the lower side wiring layer is formed directly on the lower surface of the substrate.

9. The optical waveguide device of claim 1, wherein the first optical element, the first circuit element, the second optical element, and the second circuit element are disposed on the upper surface of the substrate.

10. The optical waveguide device of claim 8, wherein the first optical element, the first circuit element, the second optical element, and the second circuit element are disposed on the upper surface of the substrate.

11. The optical waveguide device of claim 1, wherein the lower side wiring layer is disposed between the lower surface of the substrate and the optical waveguide.

12. The optical waveguide device of claim 11, wherein the first optical element, the first circuit element, the second optical element, and the second circuit element are disposed on the upper surface of the substrate.

\* \* \* \* \*